US008630822B2

(12) United States Patent
Karrat

(10) Patent No.: US 8,630,822 B2
(45) Date of Patent: Jan. 14, 2014

(54) DATA CENTER DESIGN TOOL

(75) Inventor: Wally Karrat, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 428 days.

(21) Appl. No.: 13/025,620

(22) Filed: Feb. 11, 2011

(65) Prior Publication Data

US 2012/0209573 A1      Aug. 16, 2012

(51) Int. Cl.
G06F 17/50      (2006.01)
(52) U.S. Cl.
USPC .......................................................... 703/1
(58) Field of Classification Search
USPC .......................................................... 703/1
See application file for complete search history.

(56) References Cited

U.S. PATENT DOCUMENTS

| 2007/0198383 | A1* | 8/2007 | Dow et al. ....................... 705/35 |
| 2008/0288193 | A1 | 11/2008 | Claassen et al. |
| 2009/0112522 | A1 | 4/2009 | Rasmussen |
| 2009/0113323 | A1* | 4/2009 | Zhao et al. .................. 715/764 |
| 2009/0138313 | A1* | 5/2009 | Morgan et al. ................ 705/8 |
| 2009/0201293 | A1 | 8/2009 | Tung et al. |
| 2009/0231152 | A1 | 9/2009 | Tung et al. |
| 2009/0235097 | A1 | 9/2009 | Hamilton et al. |
| 2009/0254763 | A1 | 10/2009 | Belady et al. |
| 2010/0010688 | A1 | 1/2010 | Hunter |
| 2010/0049494 | A1* | 2/2010 | Radibratovic et al. .......... 703/13 |
| 2010/0076607 | A1 | 3/2010 | Ahmed et al. |
| 2010/0235654 | A1 | 9/2010 | Malik et al. |
| 2011/0016342 | A1* | 1/2011 | Rowan et al. ................. 713/340 |

OTHER PUBLICATIONS

Kosik, W. J. "Optimizing Power Usage Effectiveness in Data Centers." Engineered Systems (Eng syst) Sep. 2007. Business News Publishing Co. USA.
Belady, C., et al. "Green Grid Data Center Power Efficiency Metrics: PUE and DCIE." White Paper #6. The Green Grid. 2008.
U.S. Appl. No. 13/948,377, entitled "Data Center Design Tool" filed Jul. 23, 2013.

* cited by examiner

*Primary Examiner* — Dwin M Craig
(74) *Attorney, Agent, or Firm* — Jason H. Sosa

(57) ABSTRACT

A data center design tool is described herein. The tool receives a number of design specifications for a proposed facility of the data center. The tool determines requirements of the data center based on the design specifications. Further, the tool receives an equipment component input and attributes of the equipment component input for the data center. The tool determines additional equipment component inputs and additional attributes based on the received design specifications, the determined requirements, and the received equipment component inputs and attributes.

20 Claims, 6 Drawing Sheets

DATA CENTER DESIGN TOOL

BACKGROUND

This disclosure relates generally to data center design and more specifically to a tool for receiving design specifications and minimal equipment information and determining additional requirements for a complete data center design.

A data center often includes servers, power supply equipment, lights, office equipment, miscellaneous equipment, and cooling equipment (collectively equipment components). Power supply equipment may include uninterruptible power supply (UPS) equipment, batteries, and power generators. Cooling equipment may include cooling towers, chillers, computer room air conditioners (CRAC), and the like. In general, a data center is designed to provide some number of kilowatts for the critical load, i.e., the electrically powered critical equipment can consume no more than the provided power.

Typically data center users want to ensure their facilities are as energy efficient as is financially sensible. The industry accepted metric used for quantifying efficiency is Power Usage Effectiveness (PUE). PUE is defined as Total Facility Power/IT Equipment Power. As such, a value approaching 1.0 would indicate 100% efficiency. Another metric used is Data Center Infrastructure Efficiency (DCiE) which is the reciprocal of PUE (1/PUE). A 0.33 DCiE would indicate that IT equipment consumes one third of a data center's power usage and would correspond to a 3 PUE. Other efficiency metrics exist, such as Data Center Performance Efficiency (DCPE) which is defined as useful work divided by total facility power.

SUMMARY

In different aspects a method, computer program product, and computer system are described for designing a data center. The method comprises a computer receiving a design specification for a proposed facility of the data center. The method further comprises the computer determining a requirement of the data center based on the design specification. The method further comprises the computer receiving an equipment component input for the data center. The computer then receives a first attribute of the equipment component input. The computer determines a second attribute of the equipment component input based on one or more of the design specification, the requirement of the data center, a previously received equipment component input, and the first attribute.

In another aspect, the computer program product comprises one or more computer-readable tangible storage devices. The computer program product further comprises program instructions, stored on at least one of the one or more storage devices. The program instructions comprise instructions to receive a design specification for a proposed facility of the data center. The program instructions further comprise instructions to determine a requirement of the data center based on the design specification. The program instructions comprise program instructions to receive an equipment component input for the data center. The program instructions comprise program instructions to receive a first attribute of the equipment component input. The program instructions also comprise instructions to determine a second attribute based on one or more of the design specification, the requirement of the data center, a previously received equipment component input, and the first attribute.

In another aspect, the computer system comprises one or more processors, one or more computer-readable memories, and one or more computer-readable tangible storage devices. The computer system further comprises program instructions, stored on at least one of the one or more storage devices for execution by at least one of the one or more processors via at least one of the one or more memories. The program instructions comprise instructions to receive a design specification for a proposed facility of the data center. The program instructions further comprise instructions to determine a requirement of the data center based on the design specification. The program instructions comprise program instructions to receive an equipment component input for the data center. The program instructions comprise program instructions to receive a first attribute of the equipment component input. The program instructions also comprise instructions to determine a second attribute based on one or more of the design specification, the requirement of the data center, a previously received equipment component input, and the first attribute.

DETAILED DESCRIPTION

Figure 1:
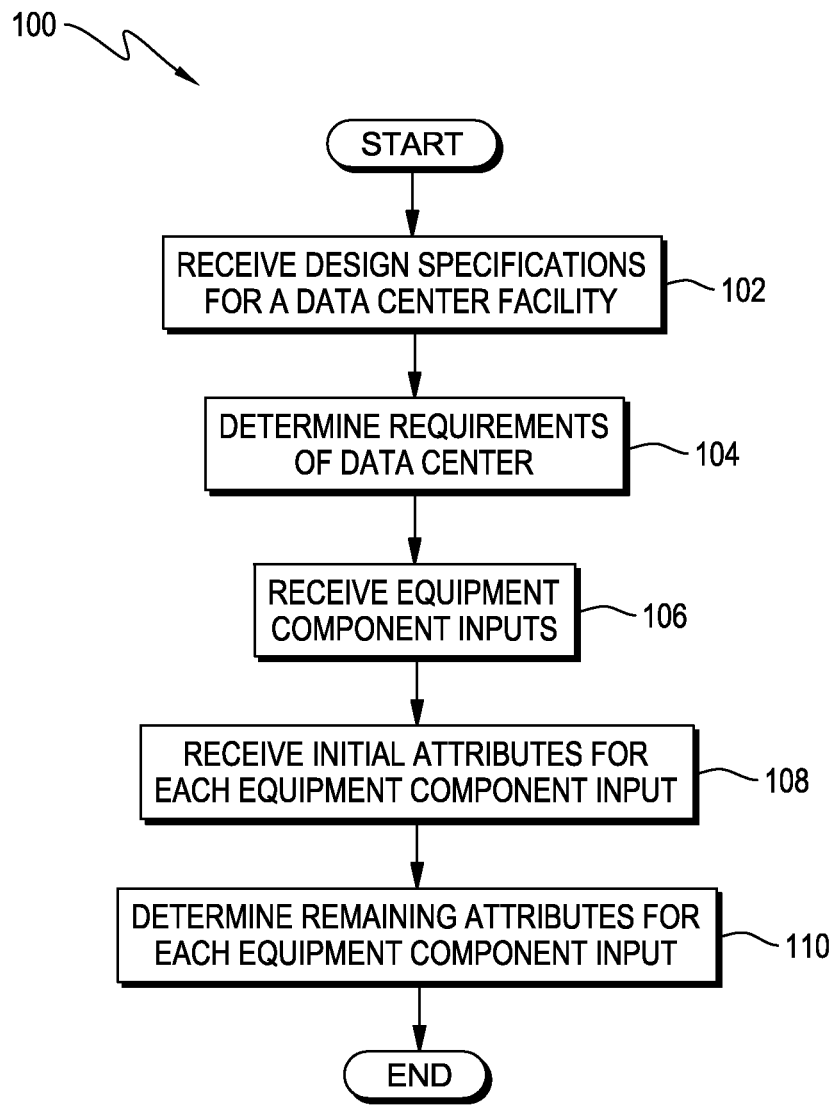
FIG. 1 is a flowchart of a process for designing a data center in accordance with an illustrative embodiment.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) having computer readable program code embodied thereon.

A computer readable storage device may be, for example, but not limited to, an electronic, magnetic, optical, or semiconductor system, apparatus, device, or any suitable combination of the foregoing. More specific examples (a non-exhaustive list) of the computer-readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing.

In the context of this document, a computer readable storage device may be any tangible device that can contain, or store a program for use by or in connection with an instruction execution system, apparatus, or device. The term "computer readable storage device" does not include a propagated data signal with computer-readable program code embodied therein, for example, in baseband or as part of a carrier wave.

Program code embodied on a computer readable storage device may be transmitted using any appropriate medium including, but not limited to, wireless, wireline, optical fiber cable, RF, etc., or any suitable combination of the foregoing.

Computer program code for carrying out operations of the present invention may be written in any combination of one or more programming languages, including an object oriented programming language such as Java, Smalltalk, C++ or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be stored in one or more computer readable storage devices that can direct a computer, other programmable data processing apparatus, or other devices to function in a particular manner, such that the instructions stored in the one or more computer readable storage devices produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process, such that the instructions which execute on the computer or other programmable apparatus provide processes for implementing the functions/acts specified in the flowchart and/or block diagram block or blocks.

FIG. 1 depicts a flowchart of a process for designing a data center in accordance with an illustrative embodiment. Program 100 is a program performing the steps of the process.

Program 100 begins by receiving a number of design specifications for a proposed data center facility (step 102). A number, as used herein with reference to an item, means one or more items. Design specifications that may be entered are comprised of a long list of potential inputs, which includes in a non-exhaustive list: size information of the facility, location information, load density information, reliability levels, energy rates, and other like information descriptive of the overall facility.

Size information, for example, may include the total area of the facility, the area of the whitespace (IT equipment), the area of offices, lobby, other support regions, and all other information regarding the space of the facility, used and unused.

Location information may comprise county, city, state, altitude, and climate—which may in turn comprise information on temperature, weather patterns, and other like information for winter, summer, other seasons, and yearly averages. In another embodiment, climate information may be entered as a separate design specification of the data center facility.

Load density information refers to the rack density, by wattage that is intended for the facility—such as racks per square foot and kW/rack, or $W/ft^2$.

Reliability levels or tiers may be described in terms of required and/or redundant equipment for UPS and mechanical systems, such as chillers, etc. Typically, redundancies can be describe in terms of N, N+1, N+2, 2N, 2(N+1), and so on.

Energy rates may be received via user input in one embodiment. In another embodiment, energy rates may be a function of location information as they are dependent upon region, utility companies, seasonal and/or power availability and other location specific factors.

The design specifications may be received through a number of user inputs. In one embodiment, a user may enter the type of specification, i.e. size, location, etc., and the corresponding data. In another embodiment, the user chooses the type of specification from a comprehensive menu of options, and then enters the corresponding data. Where a limited number of options for data input exist, such as redundancy levels, those options may also be chosen from a menu.

Based upon the design specifications received, program 100 determines a number of requirements of the data center (step 104). Requirements of the data center may comprise IT powering capacity requirements and cooling capacity requirements. In some embodiments, program 100 may display the determined requirements to a user dynamically.

Program 100 receives a number of equipment component inputs (step 106). Similar to design specifications, program 100 may receive the equipment component inputs (step 106) through a menu selection. In another embodiment a user may enter an equipment component input without the benefit of a menu.

An equipment component input refers to a desired equipment component that a user/designer intends or would like to include in the data center design. Equipment component inputs comprise, in a non-exhaustive list, UPS, CRACs/CRAHs, air and water cooled chillers, cooling tower, water pumps, fans, outside air handling units, lighting, and any other equipment component that may be used in a data center.

Each equipment component input comprises a number of attributes, for example, type, component size, motor size, load sensitive efficiency (partial load efficiency and full load efficiency), pressures, operating temperatures, equipment no load losses, quantity (minimum and/or ideal), and any other descriptive element of the equipment component input. A person skilled in the art will recognize that the attributes differ depending on the equipment component type. For example, UPS has different attributes than cooling towers.

Program 100 receives initial attributes (step 108) for each equipment component input received. Initial attributes are made up of one or more of the number of attributes of the equipment component input.

Based on one or more of the number of design specifications received, determined requirements of the data center, a number of previously received equipment component inputs, and initial attributes received for the equipment component input, program 100 determines remaining attributes of the equipment component input (step 110). The remaining attributes are made up of one or more of the attributes of the equipment component not received as initial attributes. In one embodiment, program 100 warns a user of any potential conflict between any input received and any output determined and allows for correction. In another embodiment, program 100 may display the received inputs, such as design specifications and initial attributes, and/or display the determined outputs, such as requirements of the data center and remaining attributes to a user.

Figure 2A:
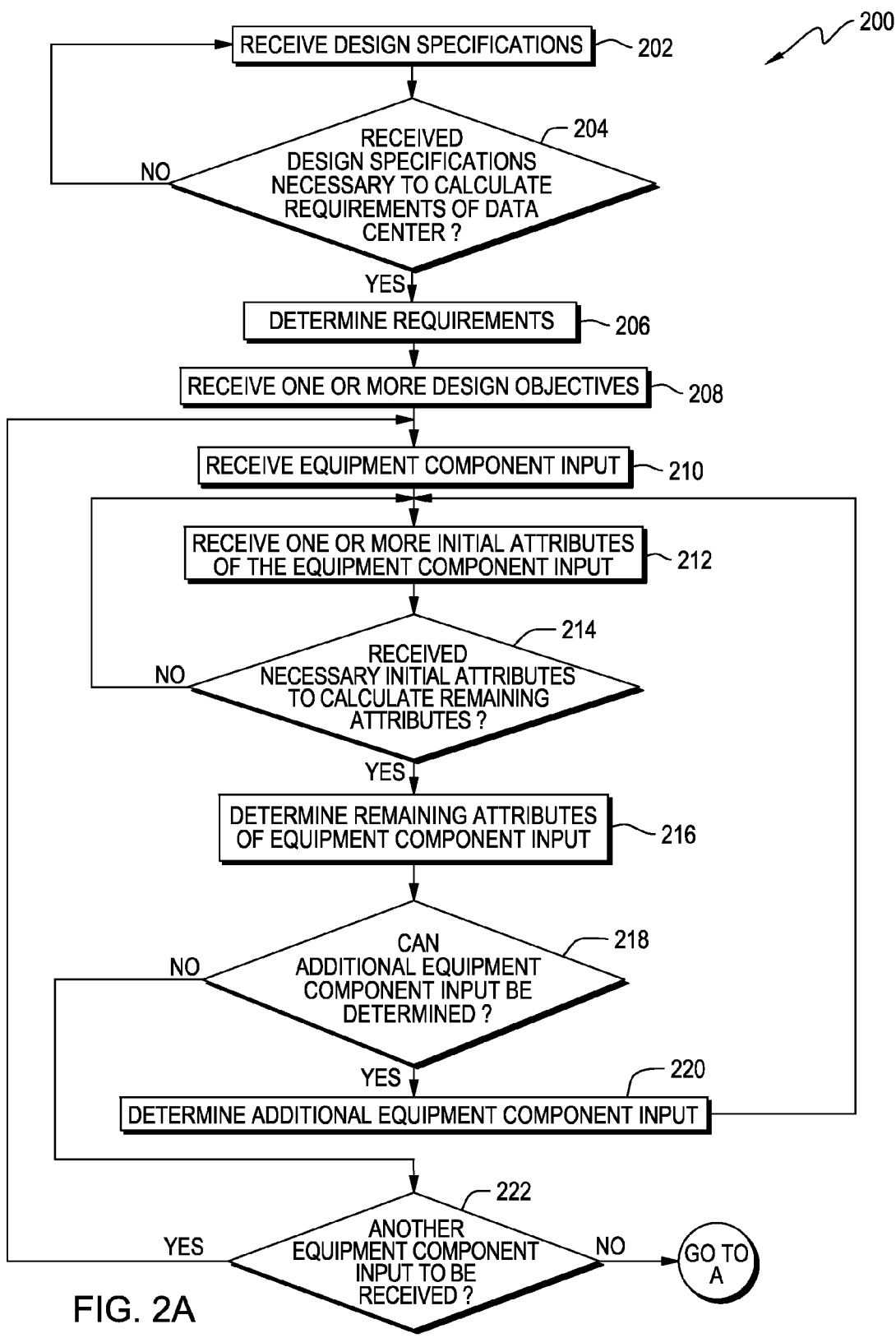
FIG. 2 is a flowchart of a process for receiving a number of design specifications, design objectives, and equipment component inputs and attributes and determining necessary requirements, components and attributes to meet the design specifications and design objectives in accordance with an illustrative embodiment.
Figure 2B:
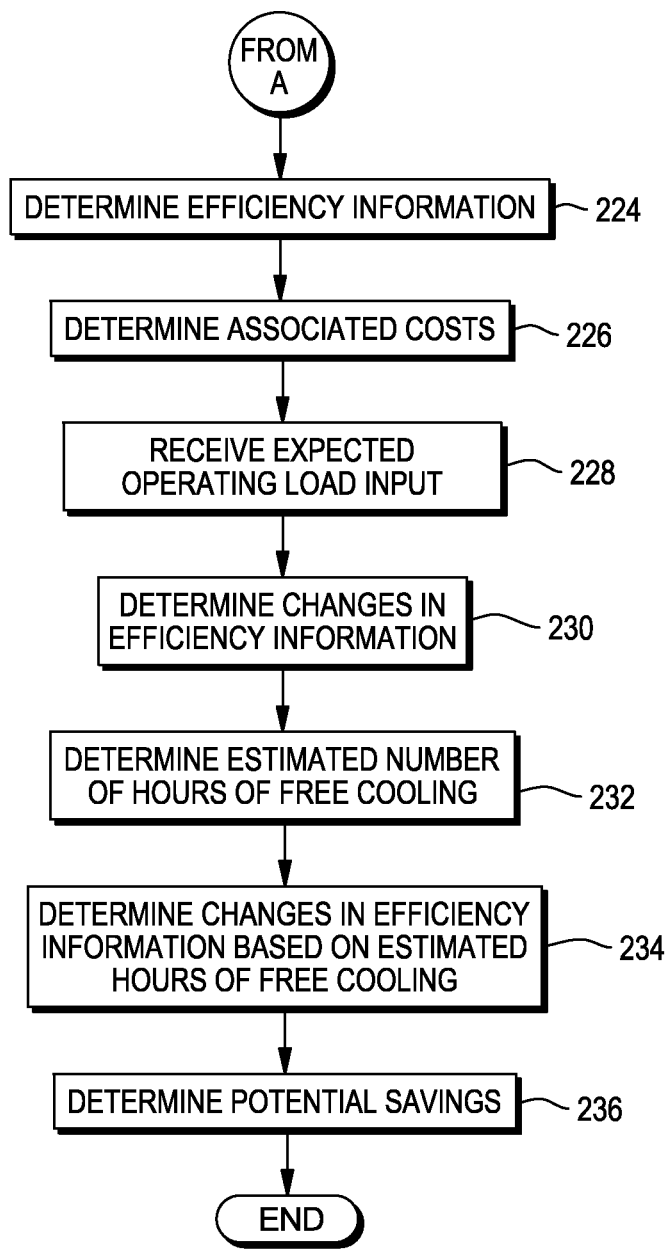

FIG. 2 depicts a flowchart of a process for receiving a number of design specifications, design objectives, and equipment component inputs and attributes and determining necessary requirements, components and attributes to meet the design specifications and design objectives in accordance with an illustrative embodiment. Program 200 performs the steps of the process.

Program 200 begins by receiving a number of design specifications (step 202) for a data center facility. Program 200 then determines if it has received the design specifications necessary to calculate one or more requirements of the data center (decision block 204). If not, program 200 returns to step 202 to receive another one or more design specifications. If yes, program 200 determines the one or more requirements of the data center (step 206).

Program 200 receives one or more design objectives (step 208) for the data center. Design objectives may comprise desired efficiencies, such as PUE or DCiE, desired costs, which may include installation costs, maintenance costs, and total cost of ownership, and other like design objectives.

Program 200 receives an equipment component input (step 210) along with one or more initial attributes of the equipment component input (step 212). If program 200 has received initial attributes necessary to calculate one or more remaining attributes (decision block 214) of the equipment component input, program 200 continues. Otherwise program 200 returns to step 212 to receive one or more additional initial attributes.

Based on one or more of the received design specifications, the determined requirements of the data center, the received design objectives, any previously received equipment component inputs and associated attributes, and the received initial attributes, program 200 determines the remaining attributes of the equipment component input (step 216). For example, a load density may be received as a design specification, and a cooling capacity requirement calculated based on the received load density. A type of chiller may be received as an equipment component input along with the planned size. Program 200 may determine the quantity of that size of chiller necessary to meet the cooling capacity requirements. If program 200 receives a design objective specifying a desired efficiency, program 200 might further limit the type of chiller that may be used, in order to meet the design objective.

Based on one or more of the received equipment component inputs, program 200 decides if an additional equipment component input can be determined (decision block 218) in order to meet requirements of the data center and/or design objectives.

If an additional equipment component input can be determined, program 200 determines the additional equipment component input (step 220) and returns to step 212 to receive initial attributes for the determined equipment component input and continue from that point in program 200.

If no additional equipment component input can be determined, program 200 decides if an additional equipment component input is to be received (decision block 222), by a user input, for example. If an additional equipment component input is to be received, program 200 returns to step 210 to receive the additional equipment component input. If no additional equipment component is to be received, program 200 proceeds to step 224.

In step 224, program 200 determines efficiency information for the data center. Based on design specifications, received and determined equipment component inputs with their respective attributes, program 200 may determine efficiency information for full and partial loads. Efficiency information may be Power Usage Effectiveness (PUE), its reciprocal Data Center Infrastructure Efficiency (DCiE), or any other metric which may be used to measure data center efficiency. Step 224 may also divide the efficiency information into mechanical efficiencies and electrical efficiencies. In other embodiments step 224 may further determine efficiency information for winter operation, summer operation, other seasonal operation, and for average yearly operation.

Program 200 may also determine associated costs (step 226) of the data center. Program 200 may base this determination on a number of factors. These factors comprise total power the data center will use, energy rates, cost of equipment components, estimated labor costs, and others. Associated costs may include average yearly energy cost, average yearly energy cost for full load operation and/or for partial load operation, seasonal energy costs, manufacturing cost, and total cost of ownership.

Program 200 may receive an expected operating load input (step 228). This input is a designer's best estimate of the operating load of the data center. Based on the received expected operating load input, program 200 may determine changes in efficiency information (step 230).

Program 200 may determine an estimated number of hours of free cooling (step 232) based on one or more of the one or more equipment component inputs and the number of design specifications. In a preferred embodiment, the estimated number of hours of free cooling may be based, in large part, on climate and weather information received as a design specification. In one embodiment, climate and weather information may be determined based on location information received as a design specification.

Program 200 may determine changes in efficiency information based on the estimated number of hours of free cooling (step 234).

Program 200 may also determine potential savings (step 236) contributable to free cooling. In a preferred embodiment program 200 calculates and displays whether it is financially advisable to attempt to use free cooling.

In some embodiments, program 200 may receive the various inputs (i.e. design specifications, equipment component inputs, initial attributes of an equipment component input) in any order and perform the corresponding determinations based only on the received inputs. Also, in various embodiments an input may be changed, corrected, or otherwise modified at any point within program 200.

In another embodiment program 200 may display one or both of the received inputs and the determinations. In some embodiments the display may update dynamically. In another embodiment, this display may be a user interface. The user interface may be one of a graphical user interface (GUI), a web-based user interface (WUI), or a more basic text-based user interface.

Figure 3:
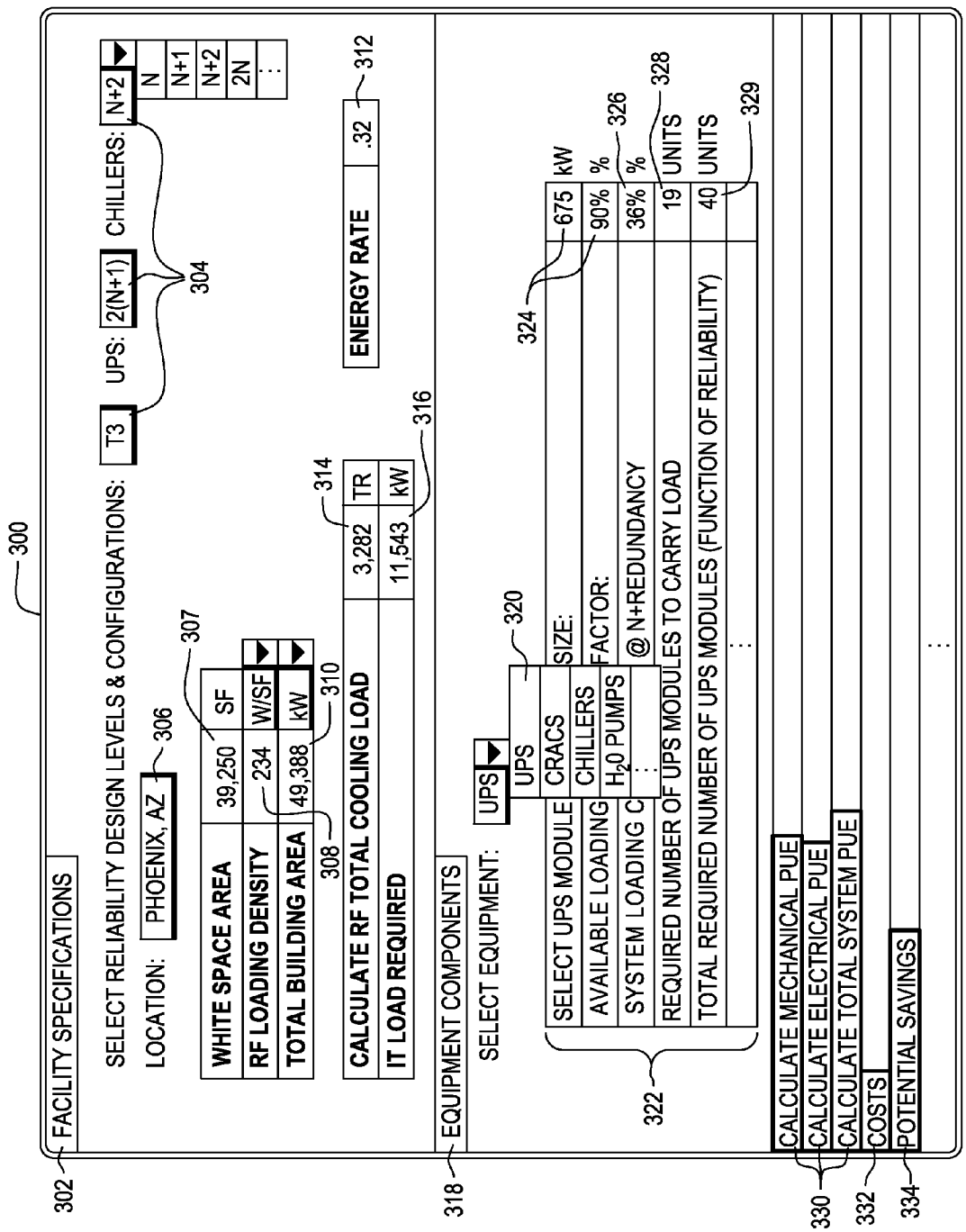
FIG. 3 is an illustration of a user interface used to receive inputs and display determinations depicted in accordance with an illustrative embodiment.

In reference now to FIG. 3, a depiction of a user interface used to receive inputs and display determinations is shown in accordance with an illustrative embodiment. User interface 300 is exemplary, and is not meant add any limitations to potential inputs, determinations, or potential display arrangements.

Facility specifications 302 is one example of a user interface field for receiving design specifications and displaying determined requirements of a data center. This layout may change in various embodiments. In one embodiment, facility specifications 302 may include more design specifications to be entered. In another embodiment, facility specifications may be devoid of preset design specifications to be entered, and a user may enter both the type and the corresponding data. Exemplary design specifications, as shown, and exemplary determinations, based on the design specifications, display in facility specifications 302.

Reliability levels 304 allow a user to enter a tier level, and redundancy configurations for both UPS and Chillers. As seen in this embodiment, a user may select reliability levels 304 from one or more drop down menus. In other embodiments a user may have to manually enter reliability levels 304. In another embodiment reliability levels may be prefilled with predefined values that a user may change.

Location 306 is one example of location information that may be entered as a design specification. In the depicted embodiment, the user may enter a city and state. In such an embodiment, an entered city and state may be linked to a database defining climate zones and/or weather patterns for that city and state. In other embodiments, location 306 may also include one or more of a climate zone to be entered, latitude and longitude, altitude, and other seasonal weather information.

White space area 307 refers to the area taken up by the IT equipment. In this embodiment, white space area 307 is measured by square feet (SF).

Load density information 308 refers to rack density, and may be entered by a user in watts per square foot (W/SF). In other embodiments other units of measurement may used to describe the load density.

Size information 310 in this embodiment may be entered as the total area of the building. As a unit of measurement, square footage is used. A user of skill in the art will understand that there may be many acceptable units of measurement, such as square meters. In other embodiments, the square footage may be divided into multiple areas, such as office space, lobby space, and other areas.

Energy rate 312 may also be entered in facility specifications 302. In other embodiments, a user may select an energy provider from a drop down list, which may be populated as a function of location information 306, with that provider's rates for the location being received automatically as energy rate 312. In another embodiment, energy rate 312 may automatically be received as the average energy rate for a given location.

User interface 300 may display cooling capacity requirement 314 as the total cooling load required for the data center based on the load density information 308 and size information 310. Further, the determined power requirements 316 for racks in the data center may also be displayed.

Equipment components 318 is an example of a user interface field for equipment component inputs. The layout and the technique used to receive equipment component inputs and corresponding attributes may vary in different embodiments.

Equipment component type 320 may be chosen from a drop menu in one embodiment. In other embodiments different techniques for receiving equipment component inputs may be used. In the depicted example, a UPS equipment component type has been chosen.

Based on the equipment component type, attributes 322 for the equipment component may display and allow a user to input values for the attributes 322. Various techniques exist for receiving attributes 322. Attributes 322 may vary drastically for different equipment component types. For example, when equipment component type 320 is a UPS, attributes 322 are far different from when equipment component type is a water pump.

In the depicted example, attributes 322 comprise: UPS module size (in kW), allowable loading factor, system loading @N+redundancy, required number of UPS modules to carry the load, and total required number of UPS modules. In other embodiments, one or more additional attributes may be included.

Initial attributes 324 are one or more attributes received for the equipment component input, typically through user input. In this example initial attributes 324 include attributes UPS module size and allowable loading factor. A user may input the size (in kW for example) of the UPS module and the percentage of allowable loading factor. In another embodiment, any of the other attributes may be inputted as initial attributes.

Remaining attributes 326, 328, and 329 are one or more attributes of equipment component input, which may be determined based on one or more of received design specifications (such as 302, 304, 306, 308, 310, and 312), determined requirements (calculated power and cooling capacity requirements such as 314 and 316), received design objectives (not shown in this example), any previously received equipment component input and associated attributes, and received initial attributes (such as 324).

For example, remaining attribute 326 (system loading @N+redundancy) may be determined based on initial attributes 324 and reliability levels 304. Remaining attribute 328 (the required number of UPS modules to carry the load), on the other hand, may be determined based on initial attributes 324 and power requirements 316. Remaining attribute 329 (total required number of UPS modules) may take into account reliability levels 304, power requirements 316, and initial attributes 324.

As is demonstrated, any combination of all previously received and determined information may be used to determine remaining attributes. In other embodiments all previously received and determined information may also be used to determine one or more additional equipment component inputs and one or more attributes associated with the one or more additional component inputs.

Efficiency information 330 depicts separate user interface fields for the determination of mechanical PUE, electrical PUE, and the total PUE of the system. Within these display sections, the respective PUE calculations may be further broken down into the many mechanical and electrical component PUEs and the overall seasonal PUE calculations, such as mechanical PUE for the summer, mechanical PUE for the winter, and so on. In other embodiments all of these determinations may reside in a single interface field. In another embodiment DCiE may be determined instead of PUE. In another embodiment still, both PUE and DCiE may be determined. Other embodiments may determine efficiencies with different efficiency metrics.

Costs 332 depicts a user interface field for the determination of one or more associated costs. Such costs may comprise average yearly energy cost, average yearly energy cost for full load operation and/or for partial load operation, seasonal energy costs, and total cost of ownership. Potential savings 334 depicts a user interface field for the determination of potential savings for a designer, for example if free cooling is used. In another embodiment, costs 332 and potential savings 334 may be combined in the same user interface field.

Figure 4:
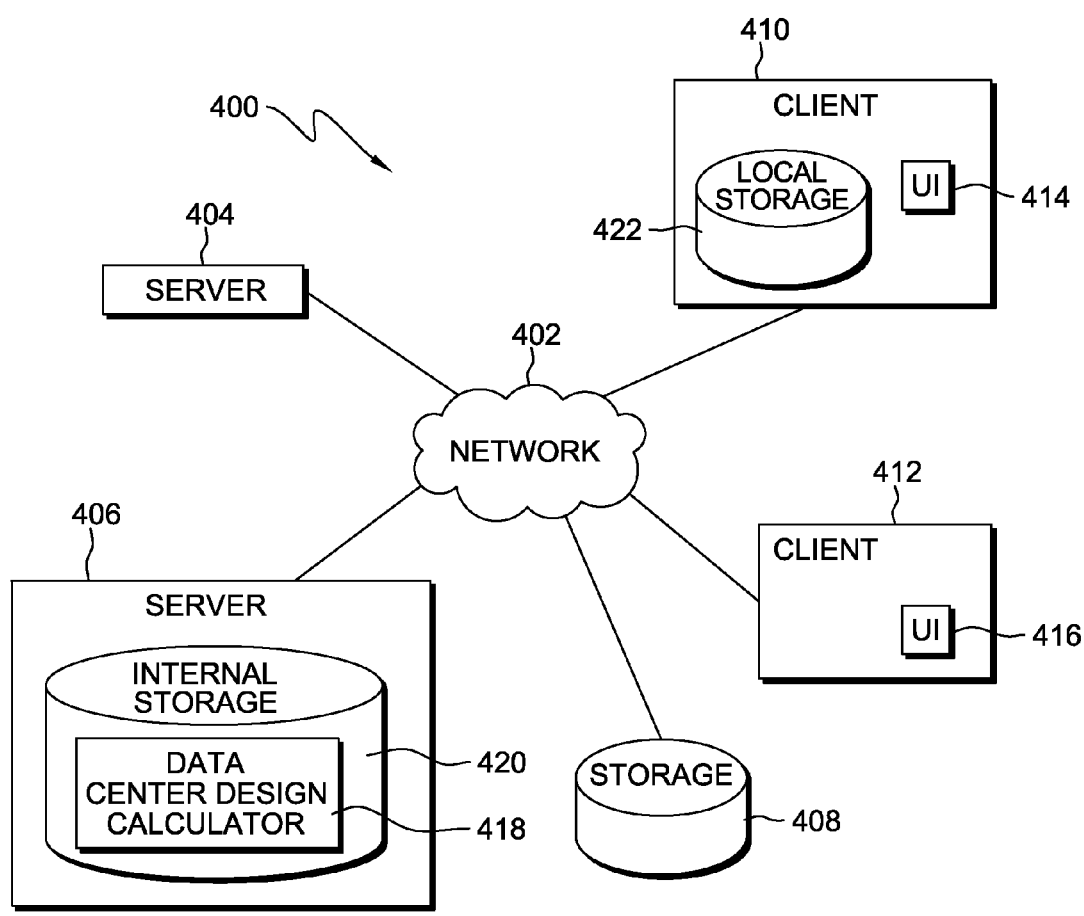
FIG. 4 is an illustrative diagram of a data processing environment, depicted as a network of data processing systems in which illustrative embodiments may be implemented.

In FIG. 4, an illustrative diagram of a data processing environment is depicted as a network of data processing systems in which illustrative embodiments may be implemented. It should be appreciated that FIG. 4 is only provided as an illustration of one implementation and is not intended to imply any limitation with regard to the environments in which different embodiments may be implemented. Many modifications to the depicted environments may be made.

Network data processing system 400 is a network of computers in which the illustrative embodiments may be implemented. Network data processing system 400 contains network 402, which is the medium used to provide communications links between various devices and computers connected together within network data processing system 400. Network 402 may include connections, such as wire, wireless communication links, or fiber optic cables.

In the depicted example, server computer 404 and server computer 406 connect to network 402 along with storage unit 408. Server computers 404 and 406 may be, for example, a management server, a web server, or any other computing device capable of receiving and sending data. Client computers 410 and 412 connect to network 402. Client computers 410 and 412 may be, for example, netbooks, laptop computers, tablet computers, desktop computers, and/or any other suitable computing device. In the depicted example, server computer 406 provides information, such as boot files, operating system images, and applications to client computers 410 and 412. Client computers 410 and 412 are clients to server computer 406 in this example. Client computers 410 and 412 may contain user interfaces (UIs) 414 and 416, respectively, that may process and display received, selected, and determined component information, efficiency information, and costs of a data center, as well as accept commands and data entry from a user. UIs 414 and 416 may be, for example, graphical user interfaces (GUIs) or web user interfaces (WUIs). Network data processing system 400 may include additional server computers, client computers, displays and other devices not shown.

Program code located in network data processing system 400 may be stored on one or more computer recordable storage devices and downloaded to a data processing system or other device for use. For example, program code, such as data center design calculator 418, may be stored on a computer recordable storage device such as internal storage 420 on server computer 406 and downloaded to client computer 410 over network 402 for use on client computer 410, and when operated may include UI 414.

In another embodiment, data center design calculator 418 runs on server computer 406, as where data center design calculator 418 is a web based program on a web server, accessible to many clients desiring to use the program. In such an embodiment, a client may access the data center design calculator 418 through UI 414 or UI 416 which may be WUIs.

Data center design calculator 418 is an example of program 100 or program 200, shown in FIGS. 1 and 2 respectively. Data center design calculator 418 may be, for example, a program capable of receiving, determining and displaying various components, efficiencies and costs of a data center.

Data gathered, generated, and maintained for use by data center design calculator 418 may be kept on server computer 406 in internal storage 420, storage unit 408, or within local storage 422 on client computer 410.

In the depicted example, network data processing system 400 is the Internet with network 402 representing a worldwide collection of networks and gateways that use the Transmission Control Protocol/Internet Protocol suite of protocols to communicate with one another. At the heart of the Internet is a backbone of high-speed data communication lines between major nodes or host computers consisting of thousands of commercial, governmental, educational and other computer systems that route data and messages.

Of course, network data processing system 400 also may be implemented as a number of different types of networks, such as, for example, an intranet, a local area network (LAN), or a wide area network (WAN). FIG. 4 is intended as an example, and not as an architectural limitation for the different embodiments.

Figure 5:
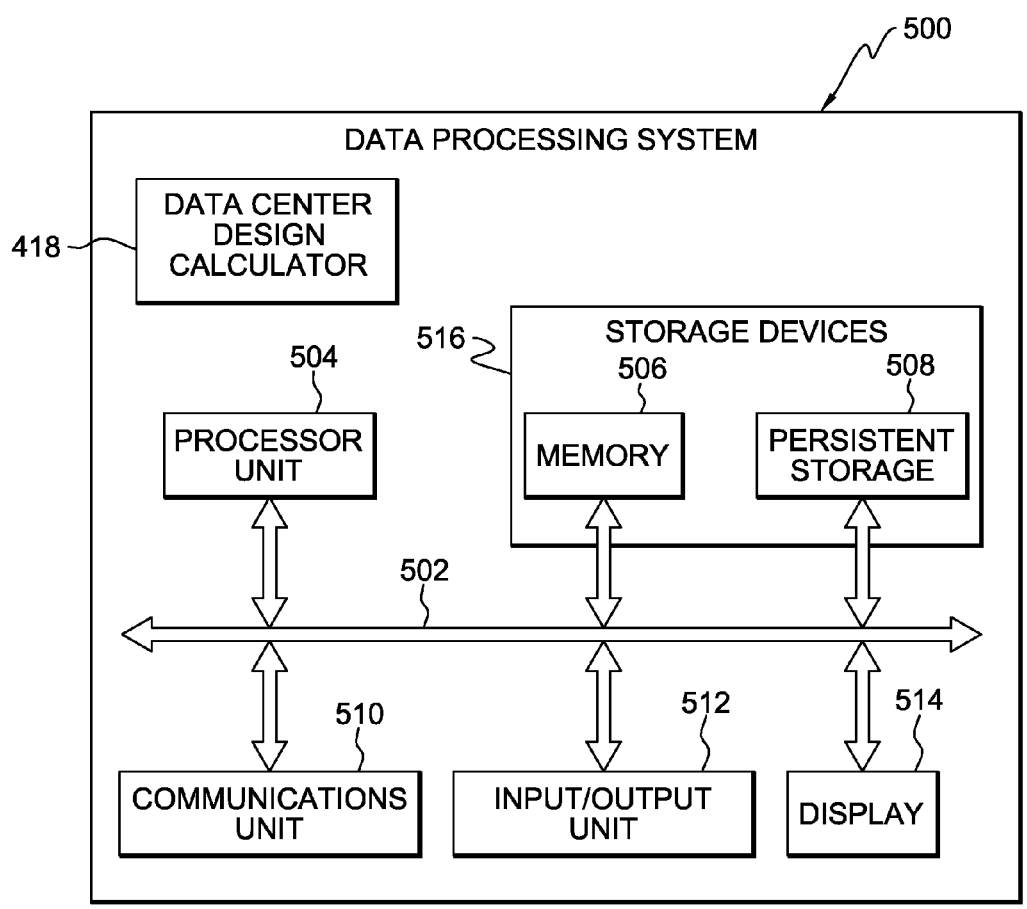
FIG. 5 is a block diagram of a data processing system, depicted in accordance with an illustrative embodiment.

Turning now to FIG. 5, a block diagram of a data processing system is depicted in accordance with an illustrative embodiment. In this example, data processing system 500 includes communications fabric 502, which provides communications between processor unit 504, memory 506, persistent storage 508, communications unit 510, input/output (I/O) unit 512, and display 514.

Processor unit 504 serves to execute instructions for software that may be loaded into memory 506. Processor unit 504 may be a number of processors, a multi-processor core, or some other type of processor, depending on the particular implementation. Further, processor unit 504 may be implemented using a number of heterogeneous processor systems in which a main processor is present with secondary processors on a single chip. As another example, processor unit 504 may be a symmetric multi-processor system containing multiple processors of the same type.

Memory 506 and persistent storage 508 are examples of storage devices 516. A storage device is any piece of hardware that is capable of storing information, such as, for example without limitation, data, program code in functional form, and/or other suitable information either on a temporary basis and/or a permanent basis. Memory 506, in these examples, may be, for example, a random access memory or any other suitable volatile or non-volatile storage device. Persistent storage 508 may take various forms depending on the particular implementation. For example, persistent storage 508 may contain one or more components or devices. For example, persistent storage 508 may be a hard drive, a flash memory, a rewritable optical disk, a rewritable magnetic tape, or some combination of the above. The media used by persistent storage 508 also may be removable. For example, a removable hard drive may be used for persistent storage 508.

Communications unit 510, in these examples, provides for communications with other data processing systems or devices. In these examples, communications unit 510 is a network interface card. Communications unit 510 may provide communications through the use of either or both physical and wireless communications links.

Input/output unit 512 allows for input and output of data with other devices that may be connected to data processing system 500. For example, input/output unit 512 may provide a connection for user input through a keyboard, a mouse, a microphone, and/or some other suitable input device. Further, input/output unit 512 may send output to a printer or to an external display. Display 514 provides a mechanism to display information to a user.

Instructions for an operating system, applications and/or programs, such as data center design calculator 418, may be located in one or more storage devices 516. Storage devices 516 are in communication with processor unit 504 through communications fabric 502. In these examples the instructions may be in a functional form on persistent storage 508. These instructions may be loaded into memory 506 for execution by processor unit 504. The processes of the different embodiments may be performed by processor unit 504 using program instructions, which may be located in one or more memories that can include memory 506.

These program instructions may also be referred to as program code or computer readable program instructions. The program instructions may be read and run by processor unit 504. The program instructions in the different embodiments may be embodied on different physical or tangible computer readable storage devices, such as memory 506 or persistent storage 508.

In some embodiments, data center design calculator 418 may be downloaded over a network, such as network 402 in FIG. 4, to persistent storage 508 from another device or data processing system via communications unit 510 for use within data processing system 500. For instance, data center design calculator 418, when stored in a computer readable storage device in a server data processing system, may be downloaded over a network from the server to data processing system 500. The data processing system providing data center design calculator 418 may be a server computer, a client computer, or some other device capable of storing and transmitting data center design calculator 418.

The different components illustrated for data processing system 500 are not meant to provide architectural limitations to the manner in which different embodiments may be implemented. The different embodiments may be implemented in a data processing system including components in addition to or in place of those illustrated for data processing system 500. Other components shown in FIG. 5 may be varied from the examples shown. The different embodiments may be implemented using any hardware device or system capable of running program code. As one example, the data processing system may include organic components integrated with inorganic components and/or may be comprised entirely of organic components excluding a human being. For example, a storage device may be comprised of an organic semiconductor.

In another example, processor unit 504 may take the form of a hardware unit that has circuits that are manufactured or configured for a particular use. This type of hardware may perform operations without needing program code to be loaded into a memory from a storage device to be configured to perform the operations.

For example, when processor unit 504 takes the form of a hardware unit, processor unit 504 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, programmable array logic, a field programmable logic array, a field programmable gate array, and other suitable hardware devices. With this type of implementation, data center design calculator 418 may be omitted because the processes for the different embodiments are implemented in a hardware unit.

In still another example, processor unit 504 may be implemented using a combination of processors found in computers and hardware units. Processor unit 504 may have a number of hardware units and a number of processors that are configured to run data center design calculator 418. Within this depicted example, some of the processes may be implemented in the number of hardware units, while other processes may be implemented in the number of processors.

In another example, a bus system may be used to implement communications fabric 502 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 506, or a cache, such as found in an interface and memory controller hub that may be present in communications fabric 502.

What is claimed is:

1. A method for designing a data center, the method comprising the steps of:
   a computer receiving a design specification for a proposed facility of the data center;
   the computer determining a requirement of the data center based on the design specification;
   the computer receiving an equipment component input for the data center;
   the computer receiving a first attribute of the equipment component input;
   the computer determining a second attribute based on one or more of the design specification, the requirement of the data center, a previously received equipment component input, and the first attribute;
   the computer determining efficiency information for the data center;
   the computer determining an estimated number of hours of free cooling based on one or more of the equipment component input and the design specification;
   the computer determining changes in the efficiency information based on the estimated number of hours of free cooling; and
   the computer determining estimated potential savings contributable to free cooling.

2. The method of claim 1, wherein:
   the design specification for the proposed facility is one of a group comprising size information, location information, load density information, reliability levels, and energy rates;
   the requirement of the data center is one of a group comprising IT powering requirements and cooling capacity requirements; and
   wherein the first and second attributes of the equipment component input are selected from a group comprising component type, component size, full load efficiency, partial load efficiency, minimum quantity needed, and total quantity needed.

3. The method of claim 1, further comprising the step of the computer determining an additional equipment component input based on one or more of the design specification, the requirement of the data center, and the received equipment component input.

4. The method of claim 1, the method further comprising the steps of:
the computer receiving a design objective for the data center; and
the computer using the design objective as an additional basis for determining the second attribute for the equipment component input.

5. The method of claim 1, the method further comprising the step of the computer determining associated costs of the data center.

6. The method of claim 1, the method further comprising the steps of:
the computer receiving an input of expected operating load; and
the computer determining changes in the efficiency information based on the input of expected operating load.

7. A computer program product comprising one or more computer-readable storage devices, not including transitory signals, and computer-readable program instructions which are stored on the one or more computer-readable storage devices and when executed by one or more processors of the computer of claim 1 perform the method of claim 1.

8. A computer system comprising one or more processors, one or more computer-readable storage devices, not including transitory signals, program instructions which are stored on the one or more computer-readable storage devices, not including transitory signals, for execution by the one or more processors and when executed by the one or more processors perform the method of claim 1.

9. A computer program product for designing a data center, the computer program product comprising:
one or more computer-readable storage devices, not including transitory signals, and program instructions stored on at least one of the one or more computer-readable storage devices, the program instructions comprising:
program instructions to receive a design specification for a proposed facility of the data center;
program instructions to determine a requirement of the data center based on the design specification;
program instructions to receive an equipment component input for the data center;
program instructions to receive a first attribute of the equipment component input;
program instructions to determine a second attribute based on one or more of the design specification, the requirement of the data center, a previously received equipment component input, and the first attribute;
program instructions to determine efficiency information for the data center;
program instructions to determine an estimated number of hours of free cooling based on one or more of the equipment component input and the design specification;
program instructions to determine changes in the efficiency information based on the estimated number of hours of free cooling; and
program instructions to determine estimated potential savings contributable to free cooling.

10. The computer program product of claim 9, wherein:
the design specification for the proposed facility is one of a group comprising size information, location information, load density information, reliability levels, and energy rates;
the requirement of the data center is one of a group comprising IT powering requirements and cooling capacity requirements; and
wherein the first and second attributes of the equipment component input are selected from a group comprising component type, component size, full load efficiency, partial load efficiency, minimum quantity needed, and total quantity needed.

11. The computer program product of claim 9, further comprising program instructions on at least one of the one or more computer-readable storage devices to determine an additional equipment component input based on one or more of the design specification, the requirement of the data center, and the received equipment component input.

12. The computer program product of claim 9, further comprising program instructions on at least one of the one or more computer-readable storage devices to:
receive a design objective for the data center; and
use the design objective as an additional basis for determining the second attribute for the equipment component input.

13. The computer program product of claim 9, further comprising program instructions on at least one of the one or more computer-readable storage devices to determine associated costs of the data center.

14. The computer program product of claim 9, further comprising program instructions on at least one of the one or more computer-readable storage devices to:
receive an input of expected operating load; and
determine changes in the efficiency information based on the input of expected operating load.

15. A computer system for designing a data center, the computer system comprising:
one or more processors, one or more computer-readable storage devices, not including transitory signals, and program instructions which are stored on the one or more computer-readable storage devices for execution by the one or more processors, the program instructions comprising:
program instructions to receive a design specification for a proposed facility of the data center;
program instructions to determine a requirement of the data center based on the design specification;
program instructions to receive an equipment component input for the data center;
program instructions to receive a first attribute of the equipment component input;
program instructions to determine a second attribute based on one or more of the design specification, the requirement of the data center, a previously received equipment component input, and the first attribute;
program instructions to determine efficiency information for the data center;
program instructions to determine an estimated number of hours of free cooling based on one or more of the equipment component input and the design specification;
program instructions to determine changes in the efficiency information based on the estimated number of hours of free cooling; and
program instructions to determine estimated potential savings contributable to free cooling.

16. The computer system of claim 15, wherein:
the design specification for the proposed facility is one of a group comprising size information, location information, load density information, reliability levels, and energy rates;
the requirement of the data center is one of a group comprising IT powering requirements and cooling capacity requirements; and wherein the first and second attributes of the equipment component input are selected from a group comprising component type, component size, full load efficiency, partial load efficiency, minimum quantity needed, and total quantity needed.

17. The computer system of claim 15, further comprising program instructions, stored on at least one of the one or more computer-readable storage devices for execution by at least one of the one or more processors to determine an additional equipment component input based on one or more of the design specification, the requirement of the data center, and the received equipment component input.

18. The computer system of claim 15, further comprising program instructions, stored on at least one of the one or more computer-readable storage devices for execution by at least one of the one or more processors to:
    receive a design objective for the data center; and
    use the design objective as an additional basis for determining the second attribute for the equipment component input.

19. The computer system of claim 15, further comprising program instructions, stored on at least one of the one or more computer-readable storage devices for execution by at least one or more processors to:
    determine associated costs of the data center.

20. The computer system of claim 15, further comprising program instructions, stored on at least one of the one or more computer-readable storage devices for execution by at least one of the one or more processors to:
    receive an input of expected operating load; and
    determine changes in the efficiency information based on the input of expected operating load.

\* \* \* \* \*